US008558225B2

(12) United States Patent
Bae et al.

(10) Patent No.: US 8,558,225 B2
(45) Date of Patent: Oct. 15, 2013

(54) OXIDE THIN FILM TRANSISTOR HAVING SOURCE AND DRAIN ELECTRODES BEING FORMED BETWEEN A PRIMARY AND A SECONDARY ACTIVE LAYERS

(75) Inventors: Jong-Uk Bae, Seoul (KR); Hyun-Sik Seo, Gyeonggi-Do (KR); Yong-Yub Kim, Incheon (KR)

(73) Assignee: LG Display Co., Ltd., Seoul (KR)

( * ) Notice: Subject to any disclaimer, the term of this patent is extended or adjusted under 35 U.S.C. 154(b) by 109 days.

(21) Appl. No.: 13/243,584

(22) Filed: Sep. 23, 2011

(65) Prior Publication Data

US 2012/0012839 A1  Jan. 19, 2012

Related U.S. Application Data

(62) Division of application No. 12/618,073, filed on Nov. 13, 2009, now Pat. No. 8,058,116.

(30) Foreign Application Priority Data

May 27, 2009 (KR) .......................... 10-2009-0046619

(51) Int. Cl.
*H01L 29/786* (2006.01)

(52) U.S. Cl.
USPC  257/43; 257/72; 257/E33.006; 257/E29.101; 257/E29.242

(58) Field of Classification Search
USPC ....................... 257/43, E33.019, 72, E33.006, 257/E29.101, E29.242
See application file for complete search history.

(56) References Cited

U.S. PATENT DOCUMENTS

| 2010/0065838 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0072469 A1 | 3/2010 | Yamazaki et al. |
| 2010/0084649 A1 | 4/2010 | Seo et al. |
| 2010/0155733 A1 | 6/2010 | Moon et al. |

FOREIGN PATENT DOCUMENTS

| CN | 102150191 A | 8/2011 |
| JP | 7235678 A | 9/1995 |
| JP | 2010092036 A | 4/2010 |
| JP | 2010097212 A | 4/2010 |

OTHER PUBLICATIONS

2nd Notification of Office Action dated Mar. 7, 2013 from The State Intellectual Property Office of China in counterpart application No. 200910207090.0.

*Primary Examiner* — Anh Mai
(74) *Attorney, Agent, or Firm* — Morgan, Lewis & Bockius LLP

(57) ABSTRACT

A method for fabricating a liquid crystal display (LCD) device include: forming a gate electrode on a substrate; forming a gate insulating layer on the substrate; forming a primary active layer having a tapered portion to a side of a channel region of the primary active layer on the gate insulating layer, and forming source and drain electrodes on the primary active layer; and forming a secondary active layer made of amorphous zinc oxide-based semiconductor on the source and drain electrodes and being in contact with the tapered portion of the primary active layer, wherein the primary active layer is etched at a low selectivity during a wet etching of the source and drain electrodes, to have the tapered portion.

4 Claims, 6 Drawing Sheets

OXIDE THIN FILM TRANSISTOR HAVING SOURCE AND DRAIN ELECTRODES BEING FORMED BETWEEN A PRIMARY AND A SECONDARY ACTIVE LAYERS

This is a divisional of U.S. patent application Ser. No. 12/618,073, filed Nov. 13, 2009, now U.S. Pat. No. 8,056,116 which is hereby incorporated by reference.

BACKGROUND OF THE INVENTION

1. Field of the Invention

The present invention relate to an oxide thin film transistor (TFT) and its fabrication method, and more particularly, to an oxide TFT having a bottom gate structure using amorphous zinc oxide-based semiconductor as an active layer, and its fabrication method.

2. Description of the Related Art

As the consumer's interest in information displays is growing and the demand for portable (mobile) information devices is increasing, research and commercialization of light and thin flat panel displays ("FPD"), which substitute cathode ray tubes (CRTs), the conventional display devices, has increased. Among FPDs, the liquid crystal display ("LCD") is a device for displaying images by using optical anisotropy of liquid crystal. LCD devices exhibit excellent resolution, color display and picture quality, so they are commonly used for notebook computers or desktop monitors, and the like.

The LCD includes a color filter substrate, an array substrate and a liquid crystal layer formed between the color filter substrate and the array substrate.

An active matrix (AM) driving method commonly used for the LCD is a method in which liquid crystal molecules in a pixel part are driven by using amorphous silicon thin film transistors (a-Si TFTs) as switching elements.

The structure of a general LCD will now be described in detail with reference to FIG. 1.

FIG. 1 is an exploded perspective view showing a related art LCD device.

As shown in FIG. 1, the LCD includes a color filter substrate 5, an array substrate 10 and a liquid crystal layer 30 formed between the color filter substrate 5 and the array substrate 10.

The color filter substrate 5 includes a color filter (C) including a plurality of sub-color filters 7 that implement red, green and blue colors, a black matrix 6 for dividing the sub-color filters 7 and blocking light transmission through the liquid crystal layer 30, and a transparent common electrode 8 for applying voltage to the liquid crystal layer 30.

The array substrate 10 includes gate lines 16 and data lines 17 which are arranged vertically and horizontally to define a plurality of pixel areas (P), TFTs (T), switching elements, formed at respective crossings of the gate lines 16 and the data lines 17, and pixel electrodes 18 formed on the pixel areas (P).

The color filter substrate 5 and the array substrate 10 are attached in a facing manner by a sealant (not shown) formed at an edge of an image display region to form a liquid crystal panel, and the attachment of the color filter substrates 5 and the array substrate 10 is made by an attachment key formed on the color filter substrate 5 or the array substrate 10.

The LCD as described above is light and has low power consumption, as such, the LCD receives much attention, but the LCD is a light receiving device, not a light emission device, having a technical limitation in brightness, a contrast ratio, a viewing angle, and the like. Thus, a new display device that can overcome such shortcomings is being developed.

An organic light emitting diode (OLED), one of new flat panel display devices, is self-emissive, having a good viewing angle and contrast ratio compared with the LCD, and because it does not require a backlight, it can be formed to be lighter and thinner. Also, the OLED is advantageous in terms of power consumption. Besides, the OLED can be driven with a low DC voltage and has a fast response speed, and in particular, the OLED is advantageous in terms of a fabrication cost.

Recently, research for an increase of a size of an OLED display device is actively ongoing, and in order to achieve such a large-scale OLED display device, development of a transistor that can secure constant current characteristics as a driving transistor of an OLED to ensure a stable operation and durability is required.

An amorphous silicon thin film transistor (TFT) used for the above-described LCD may be fabricated in a low temperature process, but has a very small mobility and fails to satisfy a constant current bias condition. Meanwhile, a polycrystalline silicon TFT has a high mobility and satisfying constant current bias condition but fails to secure uniform characteristics, making it difficult to have a large area and requiring a high temperature process.

Thus, an oxide semiconductor TFT including an active layer formed with oxide semiconductor, but in this case, if oxide semiconductor is applied to an existing TFT of a bottom gate structure, the oxide semiconductor is damaged during an etching process of source and drain electrodes, causing degeneration.

FIG. 2 is a sectional view sequentially showing the structure of a related art oxide TFT.

As shown in FIG. 2, the oxide TFT of a bottom gate structure is configured such that a gate electrode 21 and a gate insulating layer 15 are formed on a substrate 10, and an active layer 24 made of oxide semiconductor is formed on the gate insulating layer 15.

Thereafter, source and drain electrodes 22 and 23 are formed on the active layer 24. In this case, when the source and drain electrodes 22 and 23 are deposited and etched, the lower active layer 24 (in particular, a portion 'A') is damaged to cause degeneration, degrading the reliability of the device.

Namely, metal for the source and drain electrodes is limited to molybdenum-based metal in consideration of a contact resistance with the oxide semiconductor. In this case, however, when the source and drain electrodes are formed through a wet etching, the active layer is damaged due to the physical properties of the oxide semiconductor which is vulnerable to an etchant, and even when the source and drain electrodes are formed through a dry etching, the active layer is degenerated due to back-sputtering and oxygen deficiency of the oxide semiconductor.

SUMMARY OF THE INVENTION

An object of the present invention is to provide an oxide thin film transistor (TFT) using amorphous zinc oxide-based semiconductor as an active layer, and its fabrication method.

Another object of the present invention is to provide an oxide TFT capable of preventing amorphous zinc oxide-based semiconductor from being degenerated when source and drain electrodes are etched, and its fabrication method.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims thereof as well as the appended drawings.

To achieve these and other advantages and in accordance with the purpose of embodiments of the invention, as embodied and broadly described, there is provided a liquid crystal display (LCD) device including: a gate electrode formed on a substrate; a gate insulating layer formed on the gate electrode; a primary active layer formed on the gate insulating layer and having a tapered portion to the side of a channel region; source and drain electrodes formed on the primary active layer; and a secondary active layer formed on the source and drain electrodes and made of amorphous zinc oxide-based semiconductor, wherein the secondary active layer is in contact with the tapered portion of the primary active layer to thus prevent disconnection of the secondary active layer due to a step of the source and drain electrodes.

To achieve these and other advantages and in accordance with the purpose of embodiments of the invention, as embodied and broadly described, there is also provided a method for fabricating a liquid crystal display (LCD) device, including: forming a gate electrode on a substrate; forming a gate insulating layer on the substrate; forming a primary active layer having a tapered portion to a side of a channel region of the primary active layer on the gate insulating layer, and forming source and drain electrodes on the primary active layer; and forming a secondary active layer made of amorphous zinc oxide-based semiconductor on the source and drain electrodes and being in contact with the tapered portion of the primary active layer, wherein the primary active layer is etched at a low selectivity during a wet etching of the source and drain electrodes, to have the tapered portion.

It is to be understood that both the foregoing general description and the following detailed description are exemplary and explanatory and are intended to provide further explanation of embodiments as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENTS

An oxide thin film transistor (TFT) and its fabrication method according to exemplary embodiments of the present invention will now be described with reference to the accompanying drawings.

Figure 1:
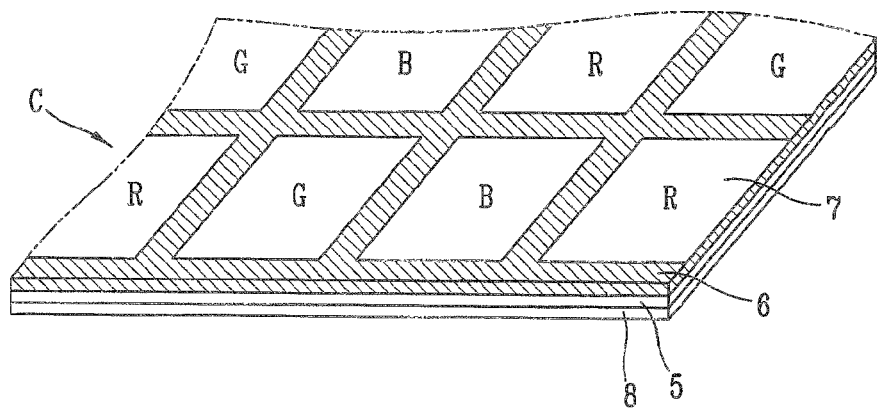
FIG. 1 is an exploded perspective view schematically showing a related art liquid crystal display (LCD) device.
Figure 1:
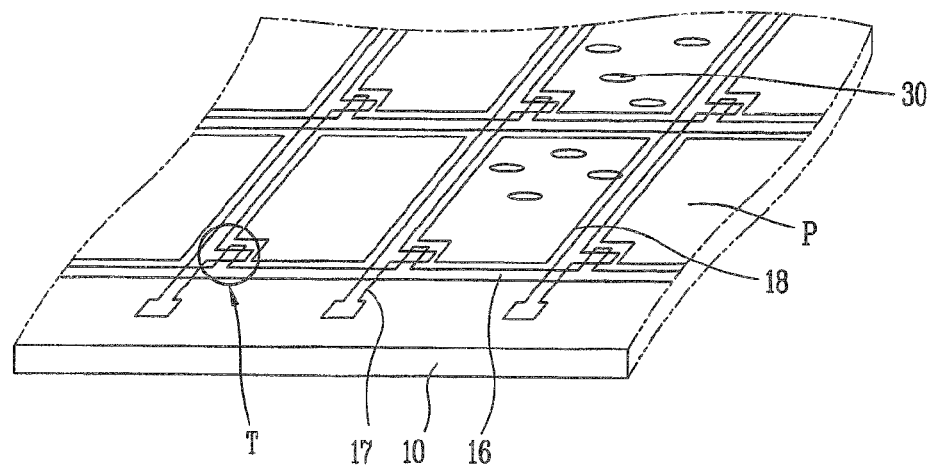
Figure 2:
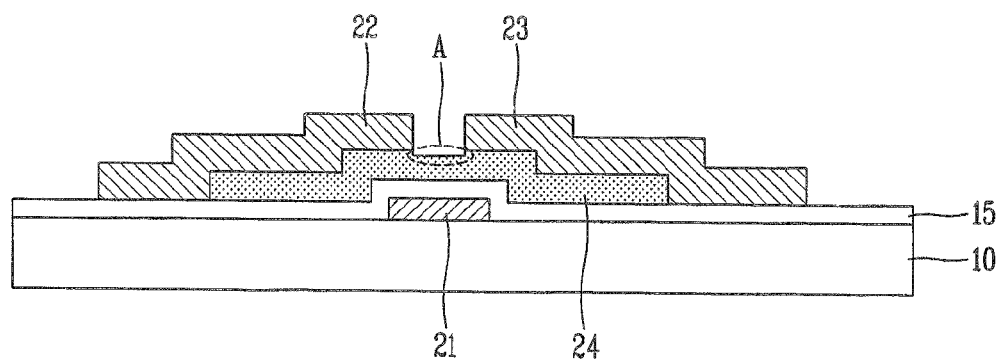
FIG. 2 is a sectional view schematically showing the structure of a related art oxide thin film transistor (TFT)
Figure 3:
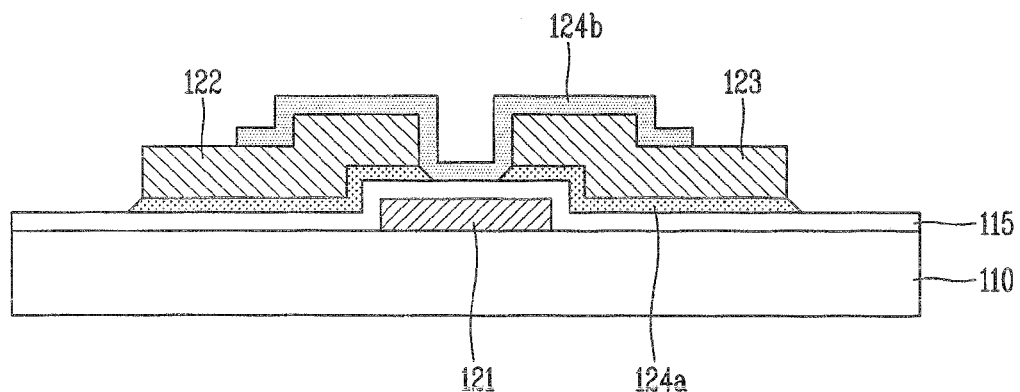
FIG. 3 is a sectional view schematically showing the structure of an oxide TFT according to a first exemplary embodiment of the present invention.

FIG. 3 is a sectional view schematically showing the structure of an oxide TFT according to a first exemplary embodiment of the present invention, in which amorphous zinc oxide-based semiconductor is used as an active layer.

As shown in FIG. 3, the oxide TFT according to the first exemplary embodiment of the present invention includes a gate electrode 121 formed on a certain substrate 110, a gate insulating layer 115 formed on the gate electrode 121, a primary active layer 124a formed on the gate insulating layer 115, source and drain electrodes 122 and 123, and a secondary active layer 124b made of amorphous zinc oxide-based semiconductor and electrically connected with the source and drain electrodes 122 and 123.

In this case, the oxide TFT according to the first exemplary embodiment of the present invention includes the secondary active layer 124b for a channel by using the amorphous zinc oxide-based semiconductor, so the high mobility and constant current bias condition are satisfied and uniform characteristics are secured so as to be advantageously applicable to a large-scale display device.

The zinc oxide (ZnO) is a material that can implement three qualities of conductivity, semiconductor quality, and resistance according to the content of oxygen. The oxide TFT employing the amorphous zinc oxide-based semiconductor material as the secondary active layer 124b can be applicable to a large-scale display device including a liquid crystal display (LCD) device and an organic light emitting display device.

In addition, recently, much interest and activities are concentrated to a transparent electronic circuit, and the oxide TFT employing the amorphous zinc oxide-based semiconductor material as the secondary active layer 124b has a high mobility and can be fabricated at a low temperature, which thus can be used for a transparent electronic circuit.

In particular, the oxide TFT according to the first exemplary embodiment of the present invention includes the secondary active layer 124b made of a-IGZO semiconductor containing heavy metal such as indium (In) and gallium (Ga) in the ZnO.

The a-IGZO semiconductor is transparent allowing visible rays to be transmitted therethrough, and the oxide TFT made of the a-IGZO semiconductor has a mobility of 1~100 cm$^2$/Vs, exhibiting higher mobility characteristics compared with the amorphous silicon TFT.

In addition, the a-IGZO semiconductor has a wide band gap, with which a UV light emitting diode (LED) having high color purity, a white LED and other components can be fabricated, and because the a-IGZO semiconductor can be processed at a low temperature, light and flexible products can be manufactured.

Moreover, the oxide TFT made of the a-IGZO semiconductor exhibits similar uniform characteristics as that of the amorphous silicon TFT, having a simple component structure like the amorphous silicon TFT and being applicable to a large-scale display.

As for the oxide TFT according to the first exemplary embodiment of the present invention having such characteristics, a carrier density of the secondary active layer 124b can be adjusted by adjusting an oxygen density within a reactive gas during sputtering, thus adjusting the device characteristics of the TFT.

In this case, the primary active layer 124a according to the first exemplary embodiment of the present invention may be made of amorphous zinc oxide-based semiconductor including a-IGZO semiconductor like the upper secondary active layer 124b. After a primary semiconductor layer made of oxide semiconductor is formed, wet etching is performed on the source and drain electrodes 122 and 123. Then, the source and drain electrodes 122 and 123 are etched at a low selectivity, generating a tapered portion formed at the side of the channel region. In this case, the tapered portion formed at the side of the primary active layer 124a acts as a contact region being in contact with the upper secondary active layer 124b, thus preventing a disconnection of the secondary active layer 124b due to a step of the source and drain electrodes 122 and 123.

As for the oxide TFT according to the first exemplary embodiment of the present invention, after the source and drain electrodes 122 and 123 are formed, a-IGZO oxide semiconductor is deposited to form the secondary active layer 124b for a channel, thereby basically solving the problem of degeneration of the oxide semiconductor generated when the source and drain electrodes 122 and 123 are etched.

Namely, the oxide semiconductor is exposed to the process such as the dry etching of the source and drain electrodes during the device fabrication, its characteristics are changed to degrade the device or its uniformity. Thus, in order to solve this problem, in the exemplary embodiment of the present invention, the source and drain electrodes 122 and 123 are formed, on which the structure of the secondary active layer 124b used as a channel is applied. This structure has shortcomings of low efficiency that the secondary active layer 124b is disconnected or contacted due to the a step of the source and drain electrodes 122 and 123, but in the exemplary embodiment of the present invention, such shortcomings are improved such that the primary semiconductor layer made of oxide semiconductor is formed, and then, the primary active layer 124a is formed to have a tapered portion by wet etching the source and drain electrodes 122 and 123 to secure a contact area with the secondary active layer 124b.

In order to freely apply the etching process of the source and drain electrodes without a limitation and improve ohmic-contact characteristics between the oxide semiconductor and the source and drain electrodes, the source and drain electrodes may be formed as a dual-layer. This will now be described through a secondary exemplary embodiment of the present invention.

Figure 4:
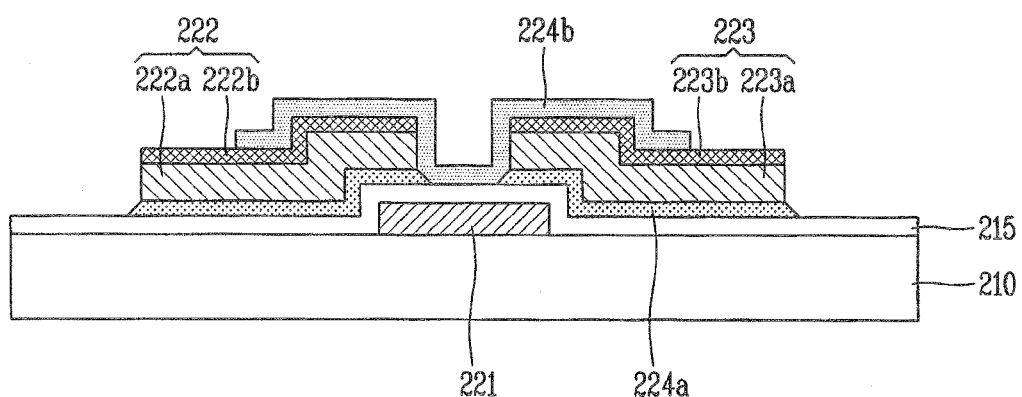
FIG. 4 is a sectional view schematically showing the structure of an oxide TFT according to a second exemplary embodiment of the present invention.

FIG. 4 is a sectional view schematically showing the structure of an oxide TFT according to a second exemplary embodiment of the present invention, which includes the same elements as those of the oxide TFT according to the first exemplary embodiment of the present invention except that the source and drain electrodes are configured as a dual-layer.

As shown in FIG. 4, the oxide TFT according to the second exemplary embodiment of the present invention includes a gate electrode 221 formed on a certain substrate 210, a gate insulating layer 215 formed on the gate electrode 221, a primary active layer 224a formed on the gate insulating layer 215, source and drain electrodes 222 and 223, and a secondary active layer 224b made of amorphous zinc oxide-based semiconductor and electrically connected with the source and drain electrodes 222 and 223.

In this case, like the oxide TFT according to the first exemplary embodiment, the oxide TFT according to the second exemplary embodiment of the present invention includes the secondary active layer 224b for a channel by using the amorphous zinc oxide-based semiconductor, so the high mobility and constant current bias condition are satisfied and uniform characteristics are secured so as to be advantageously applicable to a large-scale display device.

In particular, the oxide TFT according to the first exemplary embodiment of the present invention includes the secondary active layer 224b made of a-IGZO semiconductor containing heavy metal such as indium (In) and gallium (Ga) in the ZnO.

As for the oxide TFT according to the second exemplary embodiment of the present invention having such characteristics, a carrier density of the secondary active layer 224b can be adjusted by adjusting an oxygen density within a reactive gas during sputtering, thus adjusting the device characteristics of the TFT.

The primary active layer 224a according to the second exemplary embodiment of the present invention may be made of amorphous zinc oxide-based semiconductor including a-IGZO semiconductor like the upper secondary active layer 224b. After a primary semiconductor layer made of oxide semiconductor is formed, wet etching is performed on the source and drain electrodes 222 and 223. Then, the source and drain electrodes 222 and 223 are etched at a low selectivity, generating a tapered portion formed at the side. In this case, the tapered portion formed at the side of the primary active layer 224a acts as a contact region being in contact with the upper secondary active layer 224b, thus preventing a disconnection of the secondary active layer 224b due to a step of the source and drain electrodes 222 and 223.

As for the oxide TFT according to the first exemplary embodiment of the present invention, after the source and drain electrodes 222 and 223 are formed, a-IGZO oxide semiconductor is deposited to form the secondary active layer 224b for a channel, thereby basically solving the problem of degeneration of the oxide semiconductor generated when the source and drain electrodes 222 and 223 are etched.

In particular, in the oxide TFT according to the second exemplary embodiment of the present invention, in order to improve the ohmic-contact characteristics between the oxide semiconductor, namely, the secondary active layer 224b and the source and drain electrodes 222 and 223, the source and drain electrodes are formed as a dual-layer. The source and drain electrodes 222 and 223 include first source and drain electrodes 222a and 223a in contact with the primary active layer 224a and second source and drain electrodes 222b and 223b formed on the first source and drain electrodes 222a and 223a and being in contact with the secondary active layer 224b.

In this case, the second source and drain electrodes 222b and 223b in contact with the secondary active layer 224b may be made of metal such as titanium (Ti) or a Ti alloy having a good bonding force with oxygen or indium tin oxide (ITO), molybdenum (Mo), and the like, having good ohmic-contact characteristics with the a-IGZO oxide semiconductor. This will now be described in detail through a method of fabricating an oxide TFT.

Figure 5A:
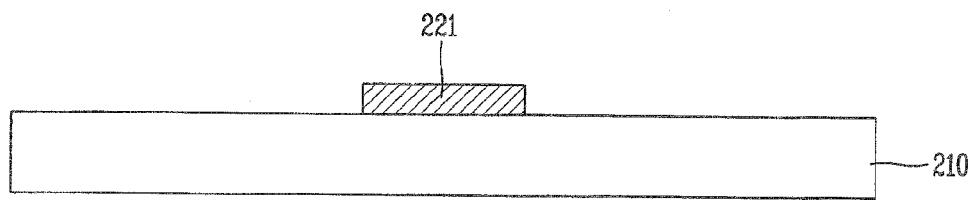
FIGS. 5A and 5C are sectional views sequentially showing the fabrication process of the oxide TFT illustrated in FIG. 4.
Figure 5B:
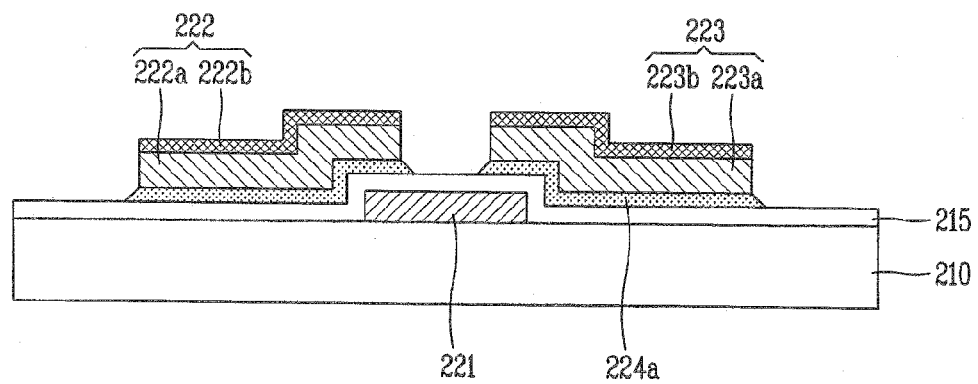
Figure 5C:
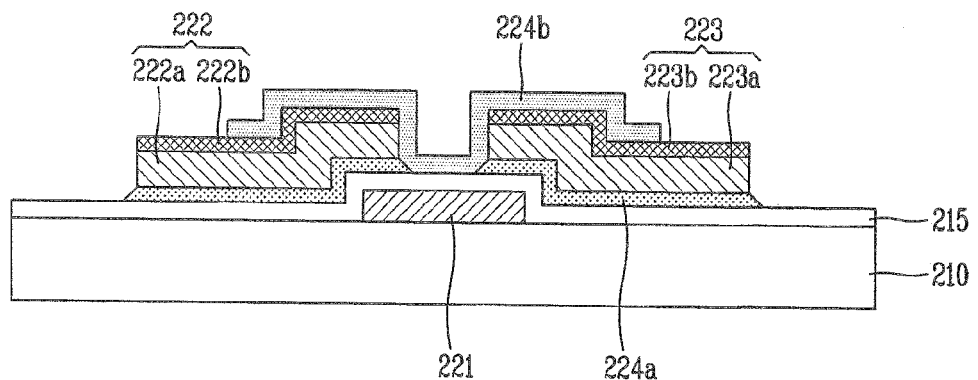

FIGS. 5A and 5C are sectional views sequentially showing the fabrication process of the oxide TFT illustrated in FIG. 4.

As shown in FIG. 5A, the gate electrode 221 is formed on the substrate 210 made of a transparent insulation material.

In this case, amorphous zinc oxide-based composite semiconductor employed for the oxide TFT according to an exemplary embodiment of the present invention is available for a low temperature deposition, so the substrate 210 that can be applicable to a low temperature process such as a plastic substrate, a soda lime glass, and the like, can be used. In addition, because the amorphous zinc oxide-based composite semiconductor has amorphous characteristics, the large-scale display substrate 210 can be used.

After a first conductive film is deposited on the entire surface of the substrate 210, it is selectively patterned through a photolithography process (a first masking process) to form the gate electrode 221.

Here, the first conductive film may be made of a low-resistance opaque conductive material such as aluminum (Al), an Al alloy, tungsten (W), copper (Cu), nickel (Ni), chromium (Cr), molybdenum (Mo), titanium (Ti), platinum (Pt), tantalum (Ta), and the like. Also, the first conductive film may be made of an opaque conductive material such as ITO, indium zinc oxide (IZO), and the like, or may be formed with a multi-layered structure by stacking two or more conductive materials.

Next, as shown in FIG. 5B, the gate insulating layer 215 is formed on the entire surface of the substrate 210 with the gate electrode 221 formed thereon.

An amorphous zinc oxide-based semiconductor layer and second and third conductive films are formed on the entire surface of the substrate 210 with the gate insulating layer 215 formed thereon, and then, the second and third conductive films are selectively pattered through a photolithography process (a second masking process) to form the source and drain electrodes 222b and 223b including the first source and drain electrodes 222a and 223a and the second source and drain electrodes 222b and 223b on the gate insulating layer 215.

At this time, the first active layer 224a made of the amorphous zinc oxide-based semiconductor is formed at the lower portion of the first source and drain electrodes 222a and 223a, and the oxide-based semiconductor is etched at a low selectivity during a wet etching of the source and drain electrodes 222 and 223, generating a certain tapered portion formed at the side.

Figure 6A:
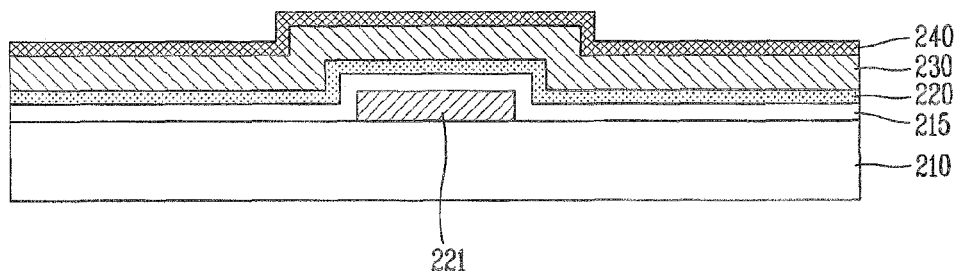
FIGS. 6A to 6C are sectional views showing a second masking process in detail according to the second exemplary embodiment of the present invention illustrated in FIG. 5B.
Figure 6B:
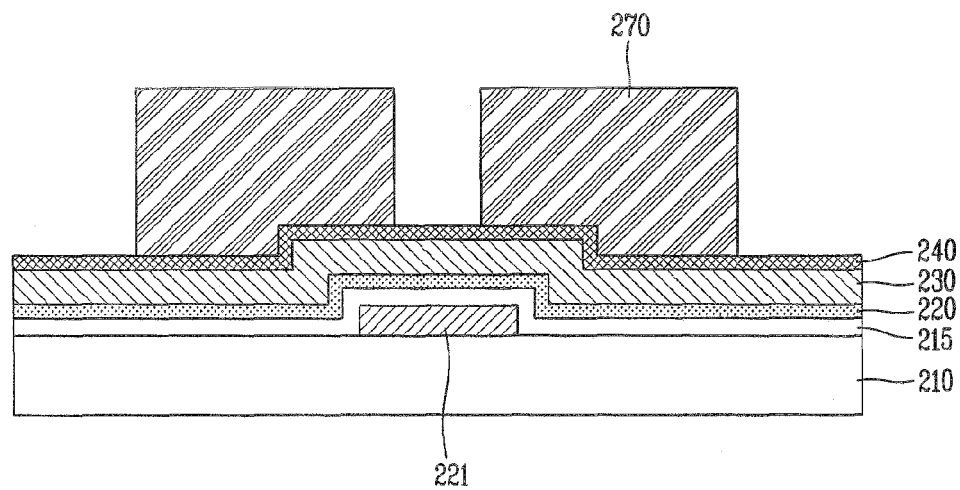
Figure 6C:
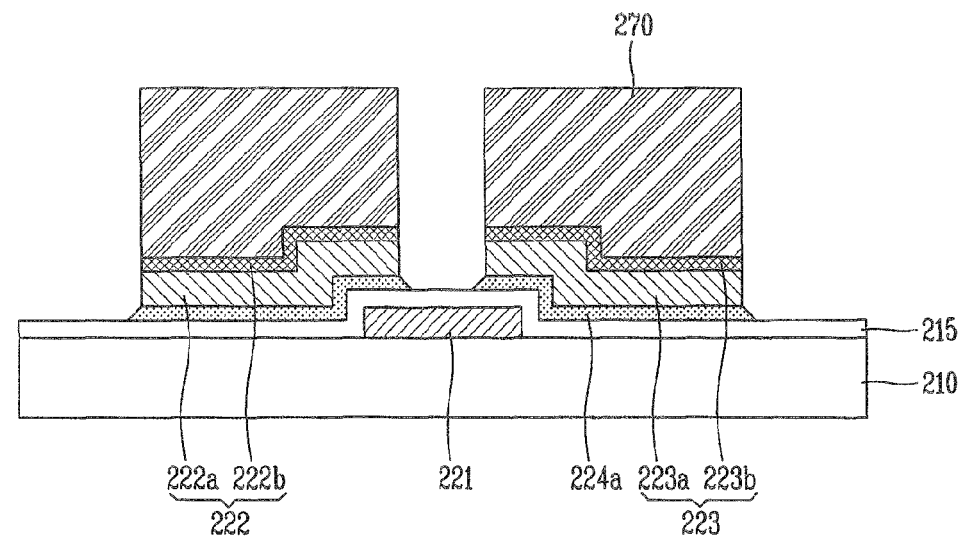

FIGS. 6A to 6C are sectional views showing a second masking process in detail according to the second exemplary embodiment of the present invention illustrated in FIG. 5B.

As shown in FIG. 6A, the gate insulating layer 215, which is formed of an inorganic insulating layer such as silicon nitride film (SiNx) or silicon oxide film ($SiO_2$) or a high dielectric oxide film such as hafnium (Hf) oxide or aluminum oxide, is formed on the entire surface of the substrate 210 with the gate electrode 221 formed thereon.

In this case, the gate insulating layer 215 may be formed through chemical vapor deposition (CVD) or plasma enhanced chemical vapor deposition (PECVD).

And then, the amorphous zinc oxide-based semiconductor layer 220 made of amorphous zinc oxide-based semiconductor and certain second and third conductive films 230 and 240 are formed on the entire surface of the substrate 210 with the gate insulating layer 215 formed thereon.

In this case, the amorphous zinc oxide-based semiconductor layer 220 may be formed to have a thickness ranging from 10 Å to 2000 Å.

The second conductive film 230 may be used regardless of the metal kinds to form the first source and drain electrodes on the amorphous zinc oxide-based semiconductor layer 220, and the third conductive film 240 may be made of metal such as titanium or a titanium alloy having good bonding force with oxygen or ITO, molybdenum, and the like, having good ohmic-contact characteristics with the a-IGZO oxide semiconductor. In addition, the source and drain electrodes may be formed to have a multi-layered structure including two or more layers.

As shown in FIG. 6B, a photosensitive film made of a photosensitive material such as photoresist is formed on the entire surface of the substrate 210 and a photosensitive film pattern 270 is formed through the second making process according to the second exemplary embodiment of the present invention.

Thereafter, as shown in FIG. 6C, the lower second and third conductive films are selectively removed by using the thusly formed photosensitive film pattern 270 as a mask to form the source and drain electrodes 222 and 223 as a dual-layer including the first source and drain electrodes 222a and 223a and the second source and drain electrodes 222b and 223b at the upper portion of the gate insulating layer 215.

In this case, the source and drain electrodes 222 and 223 are etched through a wet etching, and while the source and drain electrodes 222 and 223 are being etched, the oxide-based semiconductor is etched at a low selectivity compared with the second and third conductive films, forming the primary active layer 224a having a certain tapered portion at the side.

Here, the tapered portion formed at the side of the primary active layer 224a works as a contact area being in contact with the upper secondary active layer (not shown), thus preventing a disconnection of the secondary active layer due to a step of the source and drain electrodes 222 and 223.

As shown in FIG. 5C, amorphous zinc oxide-based semiconductor is deposited on the entire surface of the substrate 210 with the source and drain electrodes 222 and 223 of the dual-layer formed thereon to form a certain amorphous zinc oxide-based semiconductor layer, which is then selectively patterned through a photolithography process (a third masking process) to form the secondary active layer 224b which is electrically connected with the second source and drain electrodes 222b and 223b.

In this case, the amorphous zinc oxide-based composite semiconductor, particularly, the a-IGZO semiconductor, may be formed through a sputtering method by using a complex target of gallium oxide ($Ga_2O_3$), indium oxide ($In_2O_3$), zinc oxide (ZnO). Besides, it may be formed through a chemical deposition method such as the CVD, an atomic layer deposition (ALD), and the like.

In addition, the a-IGZO semiconductor may be used to form an amorphous zinc oxide-based semiconductor layer by using composite oxide targets having atomic ratios of gallium, indium and zinc of 1:1:1, 2:2:1, 3:2:1, and 4:2:1, respectively.

Here, as for the oxide TFT according to the second exemplary embodiment of the present invention, a carrier density of the secondary active layer 224b can be adjusted by adjusting an oxygen density within a reactive gas during sputtering to form the amorphous zinc oxide-based semiconductor layer, thus obtaining the device characteristics under an oxygen density 1% to 10% and under the thickness condition of 500 Å to 1000 Å.

The secondary active layer 224b according to the second exemplary embodiment of the present invention is in contact with a contact area of the primary active layer 224a having the tapered portion, thus preventing disconnection of the secondary active layer 224b due to a step of the source and drain electrodes 222 and 223. This will now be described in detail with reference to the accompanying drawings.

Figure 7:
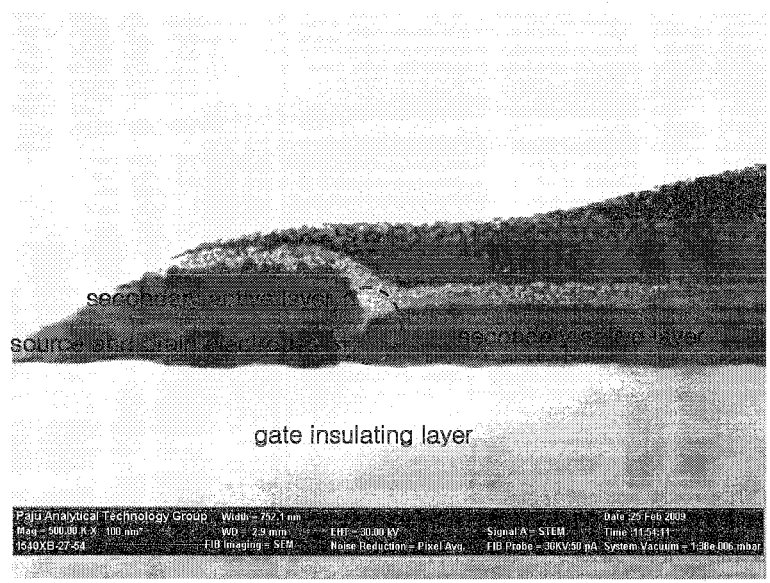
FIG. 7 is a scanning electron microscope (SEM) photograph showing a disconnection of a semiconductor due to a step of source and drain electrodes in an oxide TFT including only a secondary active layer.

FIG. 7 is a scanning electron microscope (SEM) photograph showing a disconnection of a semiconductor due to a step of source and drain electrodes in an oxide TFT including only a secondary active layer, in which the channel area of the a-IGZO semiconductor TFT is enlarged to be shown.

With reference to FIG. 7, if source and drain electrodes with a thickness of about 500 Å are formed and then an amorphous zinc oxide-based semiconductor layer is deposited to form a secondary active layer, the secondary active layer is disconnected at edge portions of the source and drain electrodes due to a step of the source and drain electrodes.

Figure 8:
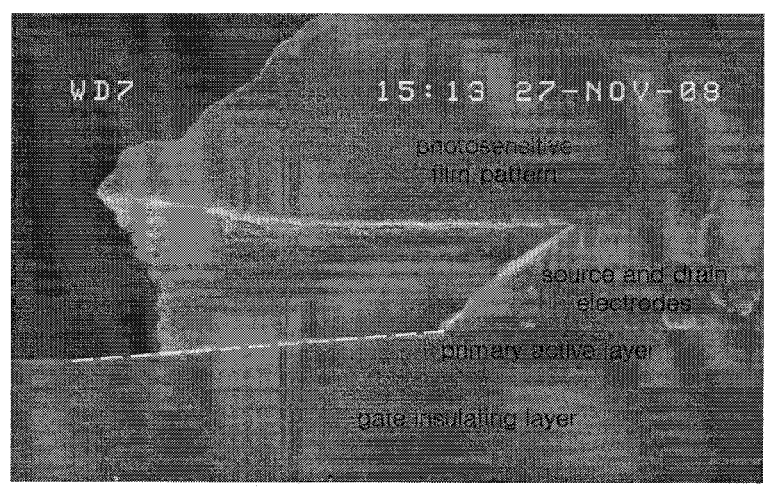
FIG. 8 is an SEM photograph showing a primary active layer tapered through a wet etching of source and drain electrodes in the oxide TFT according to an exemplary embodiment of the present invention.
Figure 9:
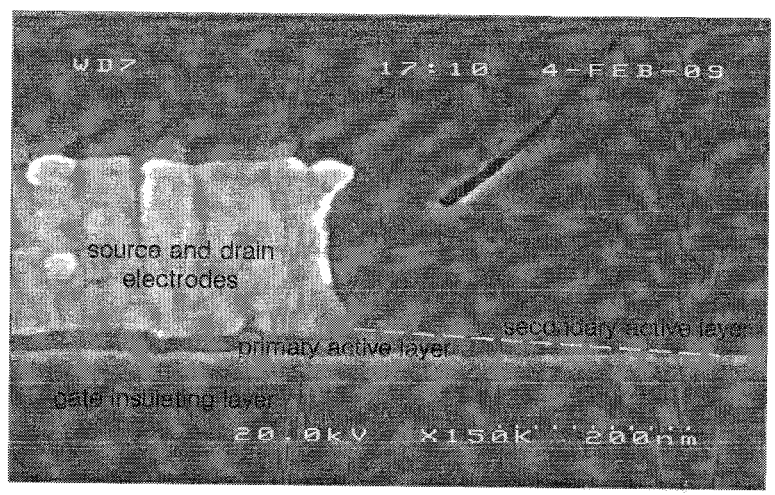
FIG. 9 is an SEM photograph showing a state that the secondary active layer is in contact with the tapered primary active layer in the oxide TFT according to an exemplary embodiment of the present invention.

FIG. 8 is an SEM photograph showing a primary active layer tapered through a wet etching of source and drain electrodes in the oxide TFT according to an exemplary embodiment of the present invention, and FIG. 9 is an SEM photograph showing a state that the secondary active layer is in contact with the tapered primary active layer in the oxide TFT according to an exemplary embodiment of the present invention.

With reference to FIG. 8, it is noted that when the primary oxide-based semiconductor layer and a conductive film for the source and drain electrodes are deposited and selectively patterned by using a photosensitive film pattern as a mask, the primary active layer having a certain tapered portion is formed at a lower portion of the source and drain electrodes.

Here, when a secondary oxide-based semiconductor layer is deposited to form a secondary active layer, as shown in FIG. 9, a sufficient contact area is secured between the primary and secondary active layers, exhibiting good inter-bonding properties.

As so far described, the present invention can be applicable to a different display device fabricated by using TFTs, for example, an OLED (Organic Light Emitting Diode) display device in which OLEDs are connected with driving transistors, as well as to the LCD device.

In addition, the present invention can be also applied for a transparent electronic circuit or a flexible display as the amorphous zinc oxide-based semiconductor material that has a high mobility and can be processed at a low temperature is applied as the active layer.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A liquid crystal display (LCD) device comprising:
   a gate electrode formed on a substrate;
   a gate insulating layer formed on the gate electrode;
   a primary active layer formed on the gate insulating layer and having a inclined protrusion to a side of a channel region of the primary active layer;
   source and drain electrodes formed on the primary active layer; and
   a secondary active layer formed on the source and drain electrodes and made of amorphous zinc oxide-based semiconductor,
   wherein the secondary active layer is in contact with the inclined protrusion of the primary active layer to thus prevent disconnection of the secondary active layer due to a step of the source and drain electrodes.

2. The device of claim 1, wherein the primary active layer is made of amorphous zinc oxide (ZnO)-based semiconductor.

3. The device of claim 1, wherein the primary active layer is formed with a thickness ranging from 10 Å to 2000 Å by using amorphous zinc oxide-based semiconductor.

4. The device of claim 1, wherein the side of the primary active layer is tapered as the primary active layer is etched at a low selectivity during a wet etching of the source and drain electrodes.

* * * * *